United States Patent
Ebner (10) Patent No.: US 8,855,991 B2
(45) Date of Patent: Oct. 7, 2014

(54) METHOD AND SYSTEM FOR ASSESSING ENVIRONMENTAL IMPACT OF A PROCESSING DEVICE

(75) Inventor: Fritz F. Ebner, Pittsford, NY (US)

(73) Assignee: Xerox Corporation, Norwalk, CT (US)

( * ) Notice: Subject to any disclaimer, the term of this patent is extended or adjusted under 35 U.S.C. 154(b) by 574 days.

(21) Appl. No.: 13/271,756

(22) Filed: Oct. 12, 2011

(65) Prior Publication Data
US 2013/0096893 A1   Apr. 18, 2013

(51) Int. Cl.
*G06F 17/50* (2006.01)
*G06G 7/62* (2006.01)
*G06Q 10/00* (2012.01)

(52) U.S. Cl.
CPC .............. *G06G 7/62* (2013.01); *G06F 17/5009* (2013.01); *G06Q 10/00* (2013.01)
USPC .......................................................... 703/13

(58) Field of Classification Search
CPC . G06Q 10/06; G06Q 10/0639; G06F 17/5009
USPC ........................................ 703/2, 13; 705/7.11
See application file for complete search history.

(56) References Cited

U.S. PATENT DOCUMENTS

| | | | |
|---|---|---|---|
| 5,652,708 A * | 7/1997 | Miyamoto et al. | 700/106 |
| 6,490,569 B1 * | 12/2002 | Grune et al. | 705/400 |
| 2003/0135431 A1 * | 7/2003 | Schwartz et al. | 705/28 |
| 2010/0315667 A1 | 12/2010 | Talbert | |

* cited by examiner

*Primary Examiner* — Kamini S. Shah
*Assistant Examiner* — Luke Osborne
(74) *Attorney, Agent, or Firm* — Fox Rothschild LLP (57) ABSTRACT

Methods and systems for assessing the environmental impact of one or more processing devices, such one or more printers, are disclosed. The system queries a life cycle assessment (LCA) service to receive a life cycle phase model for each device. The life cycle phase model includes a set of consumption variable categories associated with potential device usage during a life cycle phase. The system then receives consumption data for the device, identifies a portion of the consumption data that corresponds to the consumption variable categories in the model, and obtains an assessment of environmental impact of the device during the life cycle phase based on the consumption data.

20 Claims, 4 Drawing Sheets

METHOD AND SYSTEM FOR ASSESSING ENVIRONMENTAL IMPACT OF A PROCESSING DEVICE

BACKGROUND

This document relates to a method and system for assessing the environmental impact of an item of process equipment, such as a printer or print-related device.

Customers of managed print services are keenly interested in understanding the environmental impacts of those services. Currently, environmental assessment data is limited to actual usage of consumables such as paper, toner, and/or energy. Some systems, such as those described in U.S. Patent Application Pub. No. 2010/0315667, the disclosure of which is incorporated herein by reference in its entirety, provide assessments of the carbon footprint of a device. However, device users continue to demand more precise data.

This disclosure is directed to an improved method and system for assessing the environmental impact of one or more items of equipment in a processing or production facility, such as print devices in a print shop.

SUMMARY

In various embodiments, a method or system assesses the environmental impact of one or more processing devices that are used to produce or process an output or item, such as one or more printers that print a document. The system identifies a device and a life cycle assessment (LCA) model that is associated with each device. The system then queries an LCA service, and in response receives a life cycle phase model for each device. The life cycle phase model includes a set of consumption variable categories associated with potential device usage during a life cycle phase. The system receives consumption data for each device, identifies a portion of the consumption data that corresponds to the consumption variable categories in the model, and obtains an assessment of environmental impact of the device during the life cycle phase based on the consumption data. Based on the assessment of environmental impact, the system generates a report of environmental impact for the device, or for a group of the devices.

In some embodiments, the LCA service may execute the LCA model to generate the life cycle phase model that is sent to the system in response to the query. The system also may retrieve, from a user via a user interface, hypothetical consumption data for each device. If the user requests, the system may include the hypothetical consumption data when preparing the query for the assessment of environmental impact.

A user also may submit, via the user interface, a specified life cycle phase, of which the life cycle phase of the LCA model is a subset. If so, the system may determine a predicted environmental assessment for the user-specified life cycle phase based on the assessment of environmental impact. It may then include the predicted environmental assessment in the generated report.

In some embodiments, the system may retrieve, from the LCA server, a cradle-to-gate assessment of environmental impact for a device. If so, it may determine a predicted cradle-to-grave environmental assessment for the device based on the cradle-to-gate assessment and the assessment of environmental impact, and it may include the predicted cradle-to-grave environmental assessment in the generated report.

DETAILED DESCRIPTION

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this document is to be construed as an admission that the embodiments described in this document are not entitled to antedate such disclosure by virtue of prior invention. As used in this document, the term "comprising" means "including, but not limited to."

As used in this document, a statement that a device or system is "in electronic communication with" another device or system means that devices or systems are configured to send data, commands and/or queries to each other via a communications network. The network may be a wired or wireless network such as a local area network, a wide area network, an intranet, the Internet or another network.

For purposes of the discussion below, a "print job" refers to a specific print service that is to be completed. For example, a print job may include producing a magazine, producing a pamphlet, producing a poster, or any other print service offered by a print shop or other print service provider.

A "print device" or "printer" refers to an item of equipment that performs one or more processing functions to create a document. A print device may include, for example, a printer, copier, scanner, binding machine, document cutting machine, or a multifunction device that performs any combination of these and/or other functions on a document.

A "print shop" refers to a set of print production devices that are collectively capable of performing one or more print jobs.

A "processor" refers to a computer or other machine that performs one or more operations according to one or more programming instructions. Exemplary elements of a processor are described below in reference to FIG. 4.

Figure 1:
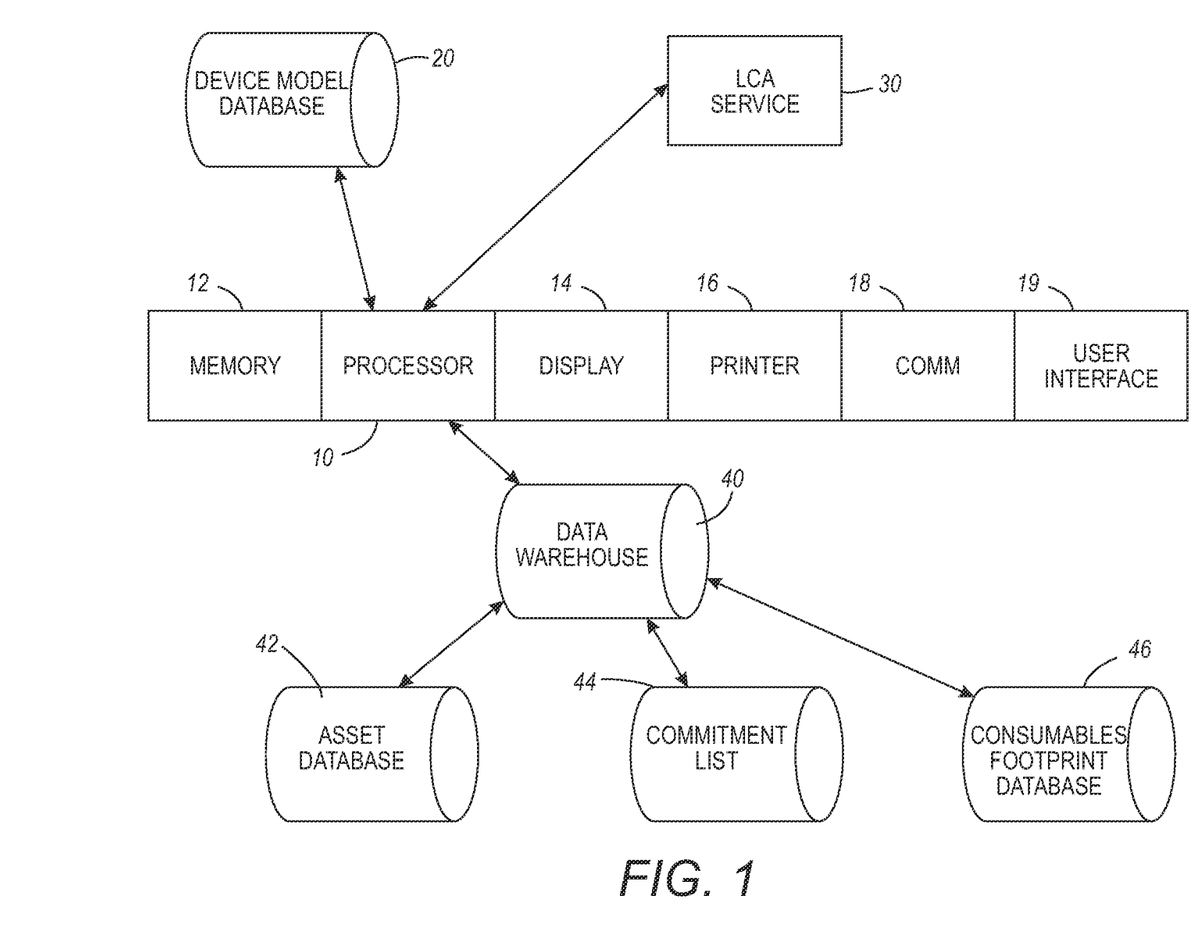
FIG. 1 illustrates exemplary elements of a production device environmental impact system.

FIG. 1 illustrates exemplary elements of a system for assessing environmental impacts of a set of print devices in a print shop. The system provides an up-to-date assessment of life cycle impact of a print shop based on actual use of devices that make up the print shop. The system illustrated in FIG. 1 includes a processor 10 that is in electronic communication with a computer-readable medium 12 that holds computer-readable program instructions that cause the processor to perform an environmental impact assessment. The processor 10 also may be in electronic communication with a display device 14, a printer 16 and a communications port 18. The system also may include a user interface 19 through which a user may enter queries or request for information. The system is in electronic communication with a device model database 20, a life cycle assessment (LCA) service 30 and a data warehouse 40 that may include or be in electronic communication one or more electronic storage media containing various databases.

Figure 2:
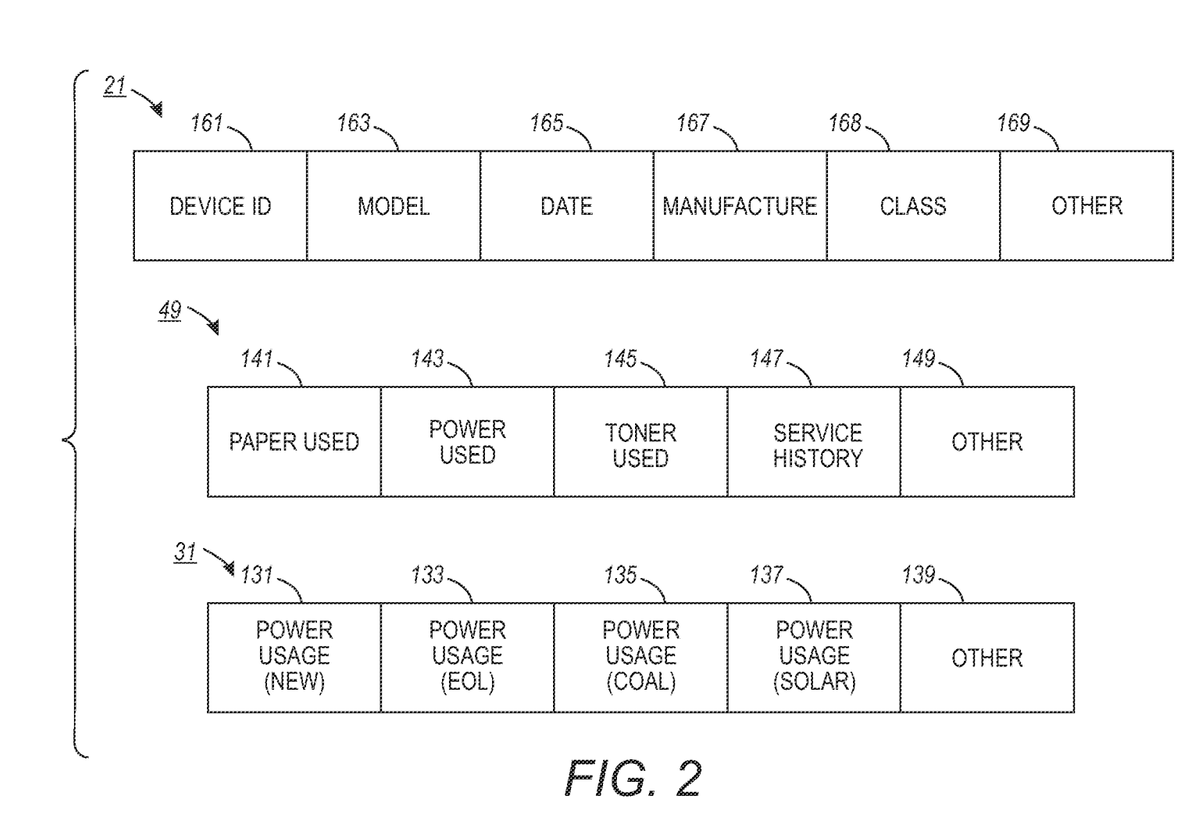
FIG. 2 illustrates exemplary data fields that may be stored in various databases of a production device environmental impact system.

The device model database 20 contains data related to design attributes of various print production devices that are included in the print shop. Referring to FIG. 2, the data 21 in the device model database may include fields such as device identifier (ID) 161 which is a unique code that may be used to identify each device and obtain other data about it as described below. The database also may include LCA model data for each device. As used in this document, an "LCA model" refers to a set of LCA model data for a device, which may include any or all of the types of data described in the ISO standards for life cycle assessment (ISO 14040:2006 and 14044:2006, as currently issued or as they may be amended in the future). For example, the available data fields may include a data field that identifies the device's model and/or version 163, a data field that identifies a date (year, month, and/or day) of manufacture 165, a sub-field that identifies the manufacturer or source 167, and a sub-field that identifies a class to which the device belongs 168 (e.g., laser or solid ink, color PPM, black and white PPM, or color capability). These or other fields may include additional data points from the manufacturer's specifications 169 such as a device weight, an average or expected number of page prints per toner cartridge, a measurement by volume or weight of the toner that fits in a toner cartridge. The LCA model data in the device model database is typically static—i.e., it covers attributes of a device that are based on its design—although the data may be updated if a device is serviced, upgraded, or otherwise changed. The processor or the LCA service may use this information to identify the device and its capabilities, environmental impacts, or other attributes.

Referring again to FIG. 1, the data warehouse 40 may contain consumption data relating to actual operation of the assets (i.e., devices or groups of devices) in the print shop. Referring to FIG. 2, consumption data 49 may include measurements of paper used over a period of time 141, power used over a period of time 143, toner used over a period of time 145, the service history of devices in the print shop 147, or other measurements of consumption 149 such as impression count, single-sided page count, duplex page count, packaging use or other measurements. Each of these data points may be housed for individual devices that make up the print shop, or the measurements may be taken for groups of devices in the print shop or the entire print shop. This data may enter the data warehouse automatically, such as from device monitors that measure the data and transmit it to the data warehouse for storage. Alternatively, this data may be manually entered into the data warehouse by a human operator. The consumption data 49 will be dynamic, as it may change or be supplemented as additional data is collected.

Referring again to FIG. 1, the data warehouse may 40 include, or it may receive, information from multiple databases that house information such as an asset database 42 containing consumption information such as that described in the previous paragraph. The databases may include a commitment list 44 containing information about how consumables must be sourced and how waste will be handled. Information in the commitment list 44 may include, for example, materials sourcing specifications or procedures for sending consumables packaging (e.g., toner cartridges) to a recycling facility. Information in the commitment list 44 may be specified by the print shop operator, and optionally it may vary by job based on customer specifications. The data warehouse also may include a consumables footprint database 46 containing environmental impact data about various consumables. This data may include, for example, the energy required or emissions generated to produce a sheet of paper, a measurement of the waste resulting from a spent toner cartridge or fuser unit, or other data.

The LCA service 30 is a database or system that supplies life cycle data for device models and consumables. The LCA service 30 may include a processor, memory, and user interface through which a user (such as an LCA expert or engineer) may perform an LCA assessment and save the resulting data for each device or consumable. The LCA data may be developed using any LCA analysis method that is now known or that may become known in the future, such as the life cycle inventory and impact assessment methods described in the ISO 14000 environmental management standards. The LCA service may have data available for various classes or devices or consumables, and it may have data available involving various stages or characteristics of a device's life or usage. Referring to FIG. 2, examples of such data 31 may include: (i) expected power usage when a device is new 131; (ii) expected power usage when a device's fuser is near the end of its life 133; (iii) environmental impacts of power used by a print shop located in a geographic area that is supplied by coal-fired power 135; (iv) environmental impacts of power used by a print shop located in a geographic area that is supplied by solar power 137; and (iv) other LCA impact assessment data 139.

Figure 3:
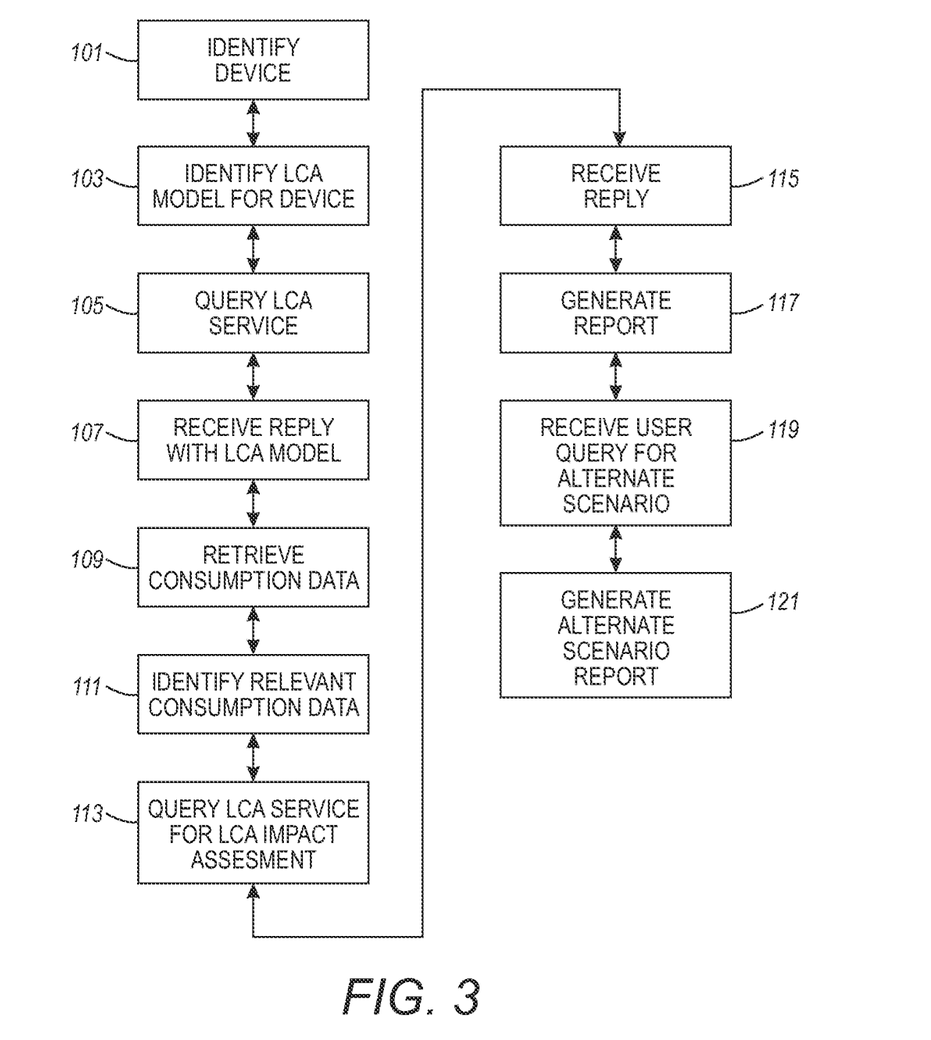
FIG. 3 illustrates exemplary steps of a method of assessing the environmental impact of a set of production devices.

FIG. 3 illustrates exemplary steps that a print device environmental impact determination system may implement. Referring to FIG. 3, instructions that reside on a computer-readable storage medium may instruct the system's processor to identify 101 a print device and access a device model database to identify 103 an LCA model that is associated with the device. The instructions may be initiated by a user query for a life cycle report for one or more devices that make up a print shop. Alternatively, the instructions may be initiated by an automated query, such as in a situation where programming instructs the system to automatically generate a life cycle report at predetermined intervals. The data in the LCA model may be data from manufacturer's specifications (such as model number, or class or type of unit) or from the print shop operator (such as geographic location) that an LCA service can use to identify appropriate life cycle data for the device. Although this paragraph and the following paragraphs refer to identification of "a device" and an LCA model that is associated "with the device", it is intended that this disclosure also encompass methods that involve groups of devices, such as multiple devices that make up a print shop or a portion of a print shop. In addition, the steps of FIG. 3 may be applied to other production or processing devices, and are not limited to printers.

The system may issue a query to an LCA service 105 in which the system requests life cycle data for the device. The query, which may be in the form of an electronic communication, may include the identified LCA model for the device. The LCA service may reply to the query, and the system may receive the reply 107. The LCA service's reply may include a life-cycle phase model for the device. The life-cycle phase model may include data corresponding to one or more life cycle phases, along with and consumption variable categories that are associated with potential usage of the device during each phase. For example, a phase may include an initial start-up phase, and the associated consumption variable category may be power usage during start-up. As another example, the associated consumption variables for a duplex printing phase may include, for example, sheet usage, toner usage, power usage and fuser degradation during duplex printing.

The system also may query a print device data warehouse and, in response, retrieve consumption data for the device 109. The system may search the database and identify a portion of the retrieved consumption data that corresponds to the consumption variable categories 111. For example, if the consumption variable categories include power usage, the retrieved consumption data may include expected carbon dioxide emissions associated with generation of the power in the area where the print shop is located. In various embodiments, the consumption data may correspond to any or all of the following categories: impression count, single-sided sheet count, duplex sheet count, power consumption, toner cartridges, fuser assemblies or other service items.

When the consumption data is retrieved, the processor may issue a second query to the LCA service 113, where the second query requests a lifecycle assessment of the device based on the retrieved consumption data. The second query may include the retrieved consumption data that corresponds to the consumption variable categories. The system will then receive a reply 115 from the LCA service with an assessment of environmental impact of the device during the life cycle phase based on the retrieved consumption data. When the LCA service generates the assessment of environmental impact, the LCA service may implement programming instructions that instruct its processor to, in response to the issuance of the second query, execute the life cycle assessment model using the retrieved consumption data.

The system's processor will use the second reply to generate a report 117 of environmental impact for the device. Generation of the report will include displaying it on the system's display device, printing it on the system's printing device, or saving it as a data file and transmitting the data file to a recipient via the system's communications port.

Generation of the report may include implementing program instructions that sum the environmental impact of various components to assess an environmental footprint of any or all of the following areas: (i) cradle to gate impact of the print device (i.e., assessment of one or more environmental impacts associated with manufacturing the device, until it reaches its manufacturing factory gate); (ii) cradle to grave impact of the print device (i.e., assessment of one or more environmental impacts associated with manufacturing the device and using the device, until it reaches its expected end of life); (iii) cradle to gate impact of one or more of the consumables; (iv) cradle to grave impact of one or more of the consumables; or (v) the environmental impact of power consumption by the device during its manufacture and/or use.

For example, in response to a user query about a device, the system may query the device model database and identify the printer's model. The system may query the LCA service for an LCA model associated with the printer, and the LCA service may return a type of toner that the printer uses and for which it has environmental impact assessment data. The system may then query the data warehouse to determine actual toner usage by the printer, and it will send this information along to the LCA service. The LCA service may then return data such as carbon dioxide ($CO_2$) generated and/or organic resources consumed per unit of toner. The system may then generate a report detailing this data. The data may be presented on a device-by-device basis, or it may be summed or otherwise aggregated with similar data for other devices in the print shop or in a subset of the print shop.

Generation of a report also may include converting any of the environmental impacts into terms that are more easily understood by a user. For example, data that measures a quantity of paper may be converted to the number of trees that are needed to produce that amount of paper. Other conversion points may include houses powered in a day (as compared to a simple measurement of power used in a day), truckloads of waste that will be sent to a landfill, an equivalent number of cars (as a benchmark for $CO_2$ emissions), or other conversions.

In various embodiments, users may use the system's user interface to request an assessment of the environmental impact for alternate scenarios in a print shop 119. An alternate scenario request may include, for example, hypothetical consumption data for the device. If so, when the system queries the LCA service for an environmental impact assessment (step 113), it may use this hypothetical data in addition to or in lieu of some or all of the consumption data. The system will generate a report of the alternate scenario 121. This report may compare environmental impact of the alternate scenario with that of actual operating data, or it may simply present the alternate scenario results so that the user may compare the results with those for the actual operating data. The alternate scenario report may help a user determine whether an operational change (such as a switch to recycled paper, or process change to refill toner cartridges) may alter the device's environmental footprint, and if so by how much the impact will change.

As another part of an alternate scenario, a user may specify a life cycle phase. The life cycle phase may represent a greater (i.e., longer, having a larger duration) life cycle phase than that which is currently known based on usage or on the LCA model. In response to the user's request, the system may determine a predicted environmental assessment for the specified life cycle based on the environmental assessment that is returned by the LCA service, and it may include the predicted environmental assessment in the generated report. For example, if available data covers a one year period, but the requested time is a four-year report, the system may extrapolate the one-year data to cover the entire four years. Depending on what is appropriate for each data point, the system may do this by multiplying each data point by 4, by considering life phase-specific data points, or by any combination of these or other procedures.

In some embodiments, the system also may request a cradle-to-gate assessment about a device 113 from the LCA server. As noted above, a cradle-to-gate assessment may include one or more environmental impacts associated with manufacturing the device or one of its consumables.

The system may then use the cradle-to-gate assessment data, sum it with the life cycle assessment data (as received in step 115), and include the result as predicted cradle-to-grave life cycle assessment for the device in the report.

For example, a cradle-to-gate assessment of the device's toner may determine that 10 pounds of $CO_2$ emissions result from manufacturing a toner cartridge. The data warehouse may indicate that a particular device uses 24 cartridges of the toner in a typical year, based on past performance, and that when spent each cartridge results in approximately 1 pound of landfilled waste. If the LCA model expects that the device will have a life of five years, then the LCA service may use these data points to determine the following life cycle assessment data points:

$CO_2$ emissions from toner manufacturing:

(10 lbs. per cartridge)×(24 cartridges per year)×5 years=1,200 lbs. $CO_2$ and
landfilled waste:

(1 lb per cartridge)×(24 cartridges per year)×5 years=120 lbs waste

Any or all of the data points in the data warehouse may be updated on a periodic basis, and the system may generate new reports as the information is updated. In addition, when generating a report for a group of devices the system may add any or all of the data points together to a report for a group of devices.

In addition, while the description set forth above is described in the context of print production devices and print shops, it may be applied to other types of equipment and other types of production facilities. For example, the system and method may be used to measure the environmental impact of one or more items of production equipment in a restaurant kitchen, in a vehicle assembly operation, in an electronics manufacturing facility, in a chemical processing facility, or in other settings.

Figure 4:
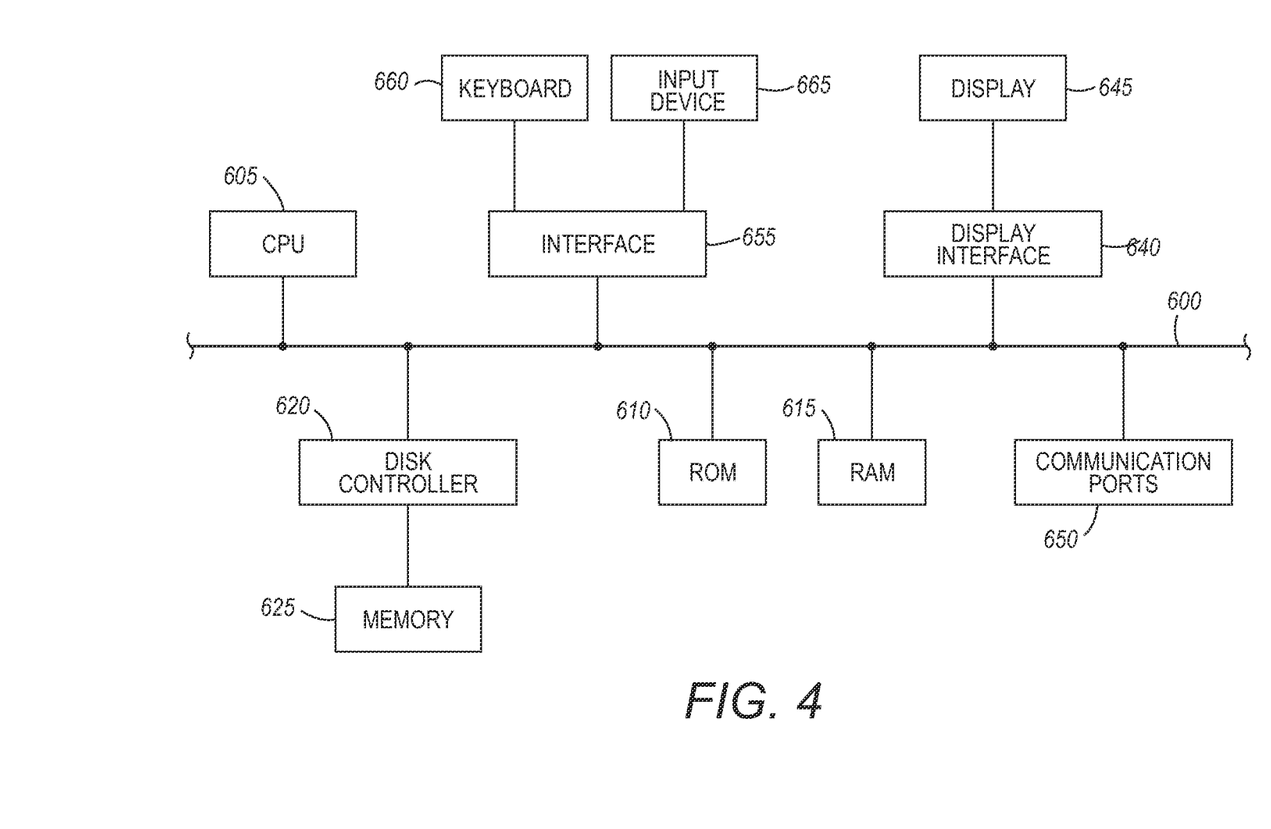
FIG. 4 illustrates various embodiments of a computing device for implementing various methods and processes described herein.

FIG. 4 depicts a block diagram of exemplary internal hardware that may be used to contain or implement the various services and processing devices as discussed above. A bus 600 serves as the main information highway interconnecting the other illustrated components of the hardware. CPU 605 is the central processing unit of the system, performing calculations and logic operations required to execute a program. CPU 605, alone or in conjunction with one or more of the other elements disclosed in FIG. 4, is an exemplary processing device, computing device or processor as such terms are used within this disclosure. Read only memory (ROM) 610 and random access memory (RAM) 615 constitute exemplary memory devices.

A controller 620 provides an interface between with one or more optional tangible, computer-readable memory devices 625 and the system bus 600. These memory devices 625 may include, for example, an external or internal DVD drive, a CD ROM drive, a hard drive, flash memory, a USB drive or the like. As indicated previously, these various drives and controllers are optional devices. Additionally, the memory devices 625 may be configured to include individual files for storing any software modules or instructions, auxiliary data, common files for storing groups of results or auxiliary, or one or more databases for storing the result information, auxiliary data, and related information as discussed above.

Program instructions, software or interactive modules for performing any the methods and systems as discussed above may be stored in the ROM 610 and/or the RAM 615. Optionally, the program instructions may be stored on a tangible computer readable medium such as a compact disk, a digital disk, flash memory, a memory card, a USB drive, an optical disc storage medium, such as a Blu-ray™ disc, and/or other recording medium. As used in this document, the phrase "computer-readable storage medium" is intended to include any such computer-readable device or tangible structure (such as 610, 615 or 625). In addition, when this document refers to computer-readable storage media as a "first" computer-readable storage medium, "second" computer-readable storage medium, etc., the reference encompasses both separate structures as well as a single structure having multiple storage locations within the structure.

An optional display interface 630 may permit information from the bus 600 to be displayed on the display 635 in audio, visual, graphic or alphanumeric format. The information may include information related to a current job ticket and associated tasks. Communication with external devices may occur using various communication ports 640. An exemplary communication port 640 may be attached to a communications network, such as the Internet or an local area network.

The hardware may also include an interface 645 which allows for receipt of data from input devices such as a keyboard 650 or other input device 655 such as a mouse, a joystick, a touch screen, a remote control, a pointing device, a video input device and/or an audio input device.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A print device environmental impact determination system, comprising:
   a processor;
   a first computer-readable storage medium on which is stored a database of life cycle assessment (LCA) model data for a plurality of print devices;
   a second computer-readable storage medium on which is stored a print device data warehouse, the data warehouse comprising operational data for a plurality of print devices; and
   a third computer-readable storage medium that holds programming instructions that instruct the processor to:
      identify a print device;
      identify an LCA model that is associated with the device;
      query an LCA service, wherein the query includes the identified LCA model;
      receive a reply from the LCA service, wherein the reply comprises a life-cycle phase model for the device, wherein the life-cycle phase model comprises a life cycle phase and a plurality of consumption variable categories that are associated with potential usage of the device during the phase;
      retrieve, from a print device data warehouse, consumption data for the device;
      identify a portion of the retrieved consumption data that corresponds to the consumption variable categories;
      query the LCA service to receive the identified portion of the retrieved consumption data that corresponds to the consumption variable categories;
      receive, from the LCA service, a reply comprising an assessment of environmental impact of the device during the life cycle phase based on the retrieved consumption data; and
      use the assessment to generate a report of environmental impact for the device.

2. The system of claim 1, wherein the LCA service comprises a fourth computer-readable storage medium that holds programming instructions that instruct the processor to, in response to the query for the identified portion of the retrieved consumption data, execute the life cycle assessment model using the retrieved consumption data and generate the reply that comprises the assessment.

3. The system of claim 1, further comprising a user interface and additional programming instructions that instruct the processor to:
   retrieve, from a user via the user interface, hypothetical consumption data for the device; and
   in response to a user request, include the hypothetical consumption data in the query for the identified portion of the retrieved consumption data.

4. The system of claim 3, further comprising additional programming instructions that instruct the processor to:
   retrieve, from a user via the user interface, a specified life cycle phase, wherein the specified life cycle phase represents a greater life cycle phase than the life cycle phase of the LCA model;

in response to a user request, determine a predicted environmental assessment for the specified life cycle phase based on the assessment of environmental impact; and include the predicted environmental assessment in the generated report.

5. The system of claim 1, further comprising additional programming instructions that instruct the processor to:

retrieve, from the LCA server, a cradle-to-gate assessment of environmental impact for the device;

determine a predicted cradle-to-grave environmental assessment for the device based on the cradle-to-gate assessment and the assessment of environmental impact; and include the predicted cradle-to-grave environmental assessment in the generated report.

6. The system of claim 1, further comprising:

a fourth computer-readable storage medium that stores the print device data warehouse;

wherein the third computer-readable storage medium holds additional programming instructions that instruct the processor to update the consumption data in the print device data warehouse for the print device with new consumption data for the print device.

7. The system of claim 1, wherein the plurality of consumption variable categories comprise two or more of paper usage, toner usage, and electricity usage.

8. A method of assessing environmental impact of a print device, comprising:

identifying, by a processor, a print device and a life cycle assessment (LCA) model that is associated with the device;

issuing, by the processor to an LCA service, a query that comprises the identified LCA model;

receiving, from the LCA service, a reply comprising a life-cycle phase model for the device, wherein the life-cycle phase model comprises a life cycle phase and a plurality of consumption variable categories that are associated with potential usage of the device during the phase;

retrieving, by the processor from a print device data warehouse, consumption data for the device;

identifying, by the processor, a portion of the retrieved consumption data that corresponds to the consumption variable categories;

issuing, by the processor to the LCA service, a query that comprises the identified portion of the retrieved consumption data that corresponds to the consumption variable categories;

receiving, from the LCA service, a reply that comprises an assessment of environmental impact of the device during the life cycle phase based on the retrieved consumption data; and generating, by the processor based on the assessment, a report of environmental impact for the device.

9. The method of claim 8, further comprising generating the reply that comprises the assessment by executing, by the LCA service, in response to the second query, a life cycle assessment model using the retrieved consumption data.

10. The method of claim 8, further comprising:

retrieving, from a user via a user interface, hypothetical consumption data for the device; and in response to a user request, including the hypothetical consumption data in the query that comprises the identified portion of the retrieved consumption data.

11. The method of claim 10, further comprising:

retrieving, from a user via the user interface, a specified life cycle phase, wherein the specified life cycle phase represents a life cycle phase of which the life cycle phase of the LCA model is a subset;

determining, by the processor in response to a user request, a predicted environmental assessment for the specified life cycle phase based on the assessment of environmental impact; and including, by the processor, the predicted environmental assessment in the generated report.

12. The method of claim 8, further comprising:

retrieving, from the LCA server, a cradle-to-gate assessment of environmental impact for the device;

determining, by the processor a predicted cradle-to-grave environmental assessment for the device based on the cradle-to-gate assessment and the assessment of environmental impact; and including the predicted cradle-to-grave environmental assessment in the generated report.

13. The method of claim 8, further comprising updating, by the processor, the consumption data in the print device data warehouse with new consumption data for the print production device.

14. The method of claim 8, wherein the device is one of a plurality of devices in a print shop, and the method further includes:

receiving environmental assessments for each of the plurality of additional devices, and generating, by the processor a print shop environmental impact report based on the environmental assessments for each of the devices in the print shop.

15. The method of claim 8, wherein the step of identifying a life cycle assessment model that is associated with the device comprises:

receiving a device identifier for the device;

accessing, by the processor, an LCA model database and retrieving an LCA model identifier that corresponds to the device identifier.

16. The method of claim 8, wherein the step of identifying a life cycle assessment model that is associated with the device comprises:

determining, by the processor based on the device identifier, an equipment class to which the device belongs;

accessing, by the processor, an LCA model database and retrieving an LCA model identifier that corresponds to the equipment class.

17. A method of assessing environmental impact of an item of processing equipment:

identifying, by a processor, an equipment item and a life cycle assessment (LCA) model that is associated with the equipment item;

issuing, by the processor to an LCA service, a first query, wherein the first query comprises the identified LCA model;

receiving a first reply from the LCA service, wherein the first reply comprises a life-cycle phase model for the equipment item, wherein the life-cycle phase model comprises a life cycle phase and a plurality of consumption variable categories that are associated with potential usage of the equipment item during the phase;

retrieving, by the processor from a data warehouse, consumption data for the equipment item;

identifying, by the processor, a portion of the retrieved consumption data that corresponds to the consumption variable categories;

issuing, by the processor to the LCA service, a second query, wherein the second query comprises the identified portion of the retrieved consumption data that corresponds to the consumption variable categories;

receiving a second reply from the LCA service, wherein the second reply comprises an assessment of environmental impact of the equipment item during the life cycle phase based on the retrieved consumption data; and generating, by the processor based on the second reply, a report of environmental impact for the equipment item.

18. The method of claim 17, further comprising generating the reply that comprises the assessment by executing, by the LCA service, in response to the second query, a life cycle assessment model using the retrieved consumption data.

19. The method of claim 18, further comprising:

retrieving, from a user via a user interface, hypothetical consumption data for the device; and in response to a user request, including the hypothetical consumption data in the query that comprises the identified portion of the retrieved consumption data.

20. The method of claim 18, further comprising:

retrieving, from a user via the user interface, a specified life cycle phase, wherein the specified life cycle phase represents a life cycle phase of which the life cycle phase of the LCA model is a subset;

determining, by the processor in response to a user request, a predicted environmental assessment for the specified life cycle based on the assessment of environmental impact; and including, by the processor, the predicted environmental assessment in the generated report.

* * * * *